United States Patent
Hoehn

(10) Patent No.: US 11,699,625 B2
(45) Date of Patent: Jul. 11, 2023

(54) POWER SEMICONDUCTOR MODULE ARRANGEMENT

(71) Applicant: Infineon Technologies AG, Neubiberg (DE)

(72) Inventor: Alexander Hoehn, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/872,436

(22) Filed: Jul. 25, 2022

(65) Prior Publication Data
US 2022/0359319 A1    Nov. 10, 2022

Related U.S. Application Data

(63) Continuation of application No. 16/866,990, filed on May 5, 2020, now Pat. No. 11,462,446.

(30) Foreign Application Priority Data

May 6, 2019    (EP) ..................... 19172724

(51) Int. Cl.
*H01L 23/00*    (2006.01)
*H01L 23/057*    (2006.01)
(Continued)

(52) U.S. Cl.
CPC ........ *H01L 23/057* (2013.01); *H01L 21/4817* (2013.01); *H01L 24/48* (2013.01);
(Continued)

(58) Field of Classification Search
CPC ... H01L 23/057; H01L 21/4817; H01L 24/48; H01L 25/072; H01L 25/50;
(Continued)

(56) References Cited

U.S. PATENT DOCUMENTS 5,751,058 A    5/1998    Matsuki
10,008,392 B2    6/2018    Hoehn et al.
(Continued)

FOREIGN PATENT DOCUMENTS

EP    2816599 A2    12/2014
JP    2003068979 A    3/2003
(Continued)

*Primary Examiner* — Elias Ullah
(74) *Attorney, Agent, or Firm* — Murphy, Bilak & Homiller, PLLC

(57) ABSTRACT

A power semiconductor module arrangement includes: a housing; first and second electrical contacts within the housing; and a mounting arrangement including a frame or body and first and second terminal elements. The mounting arrangement is inserted in and coupled to the housing. First ends of the first and second terminal elements mechanically and electrically contact the first and second electrical contacts, respectively. A middle part of each terminal element extends through the frame or body. A second end of each terminal element extends outside the housing. The first terminal element is dielectrically insulated from the second terminal element by a portion of the frame or body. The first terminal element is injected into and inextricably coupled to the frame or body. The second terminal element is arranged within a hollow space inside the frame or body and is detachably coupled to the frame or body.

14 Claims, 3 Drawing Sheets

(51) Int. Cl.
*H01L 21/48* (2006.01)
*H01L 25/07* (2006.01)
*H01L 25/00* (2006.01)

(52) U.S. Cl.
CPC ............ *H01L 25/072* (2013.01); *H01L 25/50* (2013.01); *H01L 2224/48225* (2013.01)

(58) Field of Classification Search
CPC ........... H01L 2224/48225; H01L 23/28; H01L 23/3735; H01L 2224/32225; H01L 2224/48227; H01L 2224/48472; H01L 2224/73265; H01L 23/053; H01L 23/49811; H01L 23/049; H01L 23/14; H01L 23/18
See application file for complete search history.

(56) References Cited

U.S. PATENT DOCUMENTS

| | | |
|---|---|---|
| 10,020,237 B2 | 7/2018 | Hoehn et al. |
| 2007/0187817 A1 | 8/2007 | Popp |
| 2010/0065962 A1 | 3/2010 | Bayerer et al. |
| 2011/0273861 A1 | 11/2011 | Matsumoto et al. |
| 2013/0056883 A1 | 3/2013 | Furukawa |
| 2013/0270688 A1 | 10/2013 | Ikuta et al. |
| 2013/0277819 A1 | 10/2013 | Yoshida |
| 2016/0254255 A1 | 9/2016 | Hori et al. |
| 2017/0125322 A1 | 5/2017 | Spann et al. |
| 2018/0138100 A1 | 5/2018 | Iwahashi |

FOREIGN PATENT DOCUMENTS

| | | |
|---|---|---|
| WO | 2015176985 A1 | 11/2015 |
| WO | 2018202620 A1 | 11/2018 |

POWER SEMICONDUCTOR MODULE ARRANGEMENT

TECHNICAL FIELD

The instant disclosure relates to a power semiconductor module arrangement and to a method for producing the same.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

Electrical lines or electrical connections are used to connect different semiconductor devices of the power semiconductor arrangement. Further, terminal elements are provided to contact the semiconductor arrangement from outside the housing. Such terminal elements are usually electrically coupled to the first metallization layer with a first end. A second end of the terminal elements protrudes outside the housing. The housing is usually filled with an encapsulation material in order to protect the different elements from mechanical damage as well as from harmful substances such as corrosive gases, for example. Further, the encapsulation material provides for a dielectric insulation between the different elements. However, the encapsulation material may also cause mechanical damage itself because internal tension may built up due to different coefficients of thermal expansion of the encapsulation material and the different elements.

There is a need for a power semiconductor module arrangement wherein the requirements on creepage distances are met and which is less prone to mechanical damages.

SUMMARY

A power semiconductor module arrangement includes a semiconductor substrate arranged in a housing, wherein at least one semiconductor body is arranged on the semiconductor substrate, and a mounting arrangement comprising a frame or body, a first terminal element, and a second terminal element. The mounting arrangement is inserted in and coupled to the housing. Each of the first and second terminal elements mechanically and electrically contacts the semiconductor substrate with a first end. A middle part of each of the first and second terminal elements extends through the frame or body, a second end of each of the first and second terminal elements extends outside the housing, and the first terminal element is dielectrically insulated from the second terminal element by a portion of the frame or body. The first terminal element is injected into and inextricably coupled to the frame or body, and the second terminal element is arranged within a hollow space inside the frame or body and is detachably coupled to the frame or body.

A mounting arrangement includes a frame or body, a first terminal element, and a second terminal element. The mounting arrangement is configured to be inserted in and coupled to a housing of a power semiconductor module arrangement including a semiconductor substrate arranged in the housing, wherein at least one semiconductor body is arranged on the semiconductor substrate. Each of the at least two terminal elements, when the mounting arrangement is inserted in and coupled to the housing, is configured to mechanically and electrically contact the semiconductor substrate with a first end. A middle part of each of the first and second terminal elements extends through the frame or body, a second end of each of the first and second terminal elements extends outside the housing, the first terminal element is dielectrically insulated from the second terminal element by a portion of the frame or body, the first terminal element is injected into and inextricably coupled to the frame or body, and the second terminal element is arranged within a hollow space inside the frame or body and is detachably coupled to the frame or body.

A method includes injecting a first material into an injection mold, thereby forming a frame or body of a mounting arrangement, wherein a first terminal element is arranged in the injection mold and is injected into the first material, and wherein at least one hollow space is formed in the frame or body which is free of the first material. The method further includes hardening the first material, and inserting a second terminal element into one of the at least one hollow space of the frame or body.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
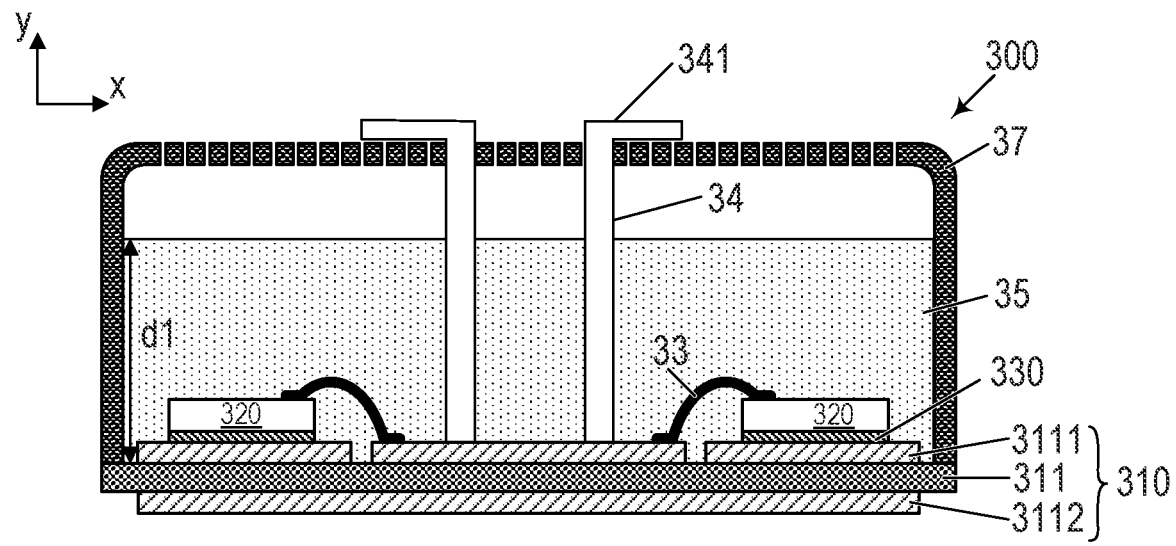
FIG. 1 is a cross-sectional view of a power semiconductor module arrangement.

Referring to FIG. 1, a cross-sectional view of a power semiconductor module arrangement 300 is schematically illustrated. The power semiconductor module arrangement 300 includes a housing 37 and a semiconductor substrate 310. The semiconductor substrate 310 includes a dielectric insulation layer 311, a (structured) first metallization layer 3111 attached to the dielectric insulation layer 311, and a second (structured) metallization layer 3112 attached to the dielectric insulation layer 311. The dielectric insulation layer 311 is disposed between the first and second metallization layers 3111, 3112.

Each of the first and second metallization layers 3111, 3112 may consist of or include one of the following materials: copper; a copper alloy; aluminum; an aluminum alloy; any other metal or alloy that remains solid during the operation of the power semiconductor module arrangement. The semiconductor substrate 310 may be a ceramic substrate, that is, a substrate in which the dielectric insulation layer 311 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 310 may, e.g., be a Direct Copper Bonding (DCB) substrate, a Direct Aluminum Bonding (DAB) substrate, or an Active Metal Brazing (AMB) substrate. Further, the substrate 310 may be an Insulated Metal Substrate (IMS). An Insulated Metal Substrate generally comprises a dielectric insulation layer 311 comprising (filled) materials such as epoxy resin or polyimide, for example. The material of the dielectric insulation layer 311 may be filled with ceramic particles, for example. Such particles may comprise, e.g., $Si_2O$, $Al_2O_3$, AlN, or BrN and may have a diameter of between about 1 µm and about 50 µm. The substrate 310 may also be a conventional printed circuit board (PCB) having a non-ceramic dielectric insulation layer 311. For instance, a non-ceramic dielectric insulation layer 311 may consist of or include a cured resin.

The semiconductor substrate 310 is arranged in a housing 37. In the example illustrated in FIG. 1, the semiconductor substrate 310 forms a ground surface of the housing 37, while the housing 37 itself solely comprises sidewalls and a cover. This is, however, only an example. It is also possible that the housing 37 further comprises a ground surface and the semiconductor substrate 310 be arranged inside the housing 37. According to another example, the semiconductor substrate 310 may be mounted on a base plate (not illustrated in FIG. 1). In some power semiconductor module arrangements 300, more than one semiconductor substrate 310 is arranged on a single base plate (not illustrated). The base plate may form a ground surface of the housing 37, for example.

One or more semiconductor bodies 320 may be arranged on the at least one semiconductor substrate 310. Each of the semiconductor bodies 320 arranged on the at least one semiconductor substrate 310 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 320 may form a semiconductor arrangement on the semiconductor substrate 310. In FIG. 1, only two semiconductor bodies 320 are exemplarily illustrated. The second metallization layer 3112 of the semiconductor substrate 310 in FIG. 1 is a continuous layer. The first metallization layer 3111 is a structured layer in the example illustrated in FIG. 1. "Structured layer" means that the first metallization layer 3111 is not a continuous layer, but includes recesses between different sections of the layer. Such recesses are schematically illustrated in FIG. 1. The first metallization layer 3111 in this example includes three different sections. This, however, is only an example. Any other number of sections is possible. Different semiconductor bodies 320 may be mounted to the same or to different sections of the first metallization layer 3111. Different sections of the first metallization layer may have no electrical connection or may be electrically connected to one or more other sections using, e.g., bonding wires 33. Electrical connections 33 may also include connection plates or conductor rails, for example, to name just a few examples. The one or more semiconductor bodies 320 may be electrically and mechanically connected to the semiconductor substrate 310 by an electrically conductive connection layer 330. Such an electrically conductive connection layer may be a solder layer, a layer of an electrically conductive adhesive, or a layer of a sintered metal powder, e.g., a sintered silver powder, for example.

According to other examples, it is also possible that the second metallization layer 3112 is a structured layer. It is further possible to omit the second metallization layer 3112. It is also possible that the first metallization layer 3111 is a continuous layer, for example.

The power semiconductor module arrangement 300 illustrated in FIG. 1 further includes terminal elements 34. The terminal elements 34 are electrically connected to the first metallization layer 3111 and provide an electrical connection between the inside and the outside of the housing 37. The terminal elements 34 may be electrically connected to the first metallization layer 3111 with a first end, while a second end 341 of the terminal elements 34 protrudes out of the housing 37. The terminal elements 34 may be electrically contacted from the outside at their second end 341. A first part of the terminal elements 34 may extend through the inside of the housing 37 in a vertical direction y. The vertical direction y is a direction perpendicular to a top surface of the semiconductor substrate 310, wherein the top surface of the semiconductor substrate 310 is a surface on which the at least one semiconductor body 320 is mounted. The second ends 341 of the terminal elements 34 may be bent such that they extend in a first horizontal direction x which is parallel to the top surface of the semiconductor substrate 310. In this way it may be easier to electrically contact the second ends 341. The terminal elements 334 illustrated in FIG. 1, however, are only examples. Terminal elements 334 may be implemented in any other way and may be arranged anywhere within the housing 37. For example, one or more terminal elements 34 may be arranged close to or adjacent to the sidewalls of the housing 37. Terminal elements 34 could also protrude through the sidewalls of the housing 37 instead of through the cover. It is also possible that the second ends 341 extend in the vertical direction y instead of being bent in the first horizontal direction x. Any other suitable implementation is possible.

The semiconductor bodies 320 each may include a chip pad metallization (not specifically illustrated), e.g., a source, drain, anode, cathode or gate metallization. A chip pad metallization generally provides a contact surface for electrically connecting the semiconductor body 320. The chip pad metallization may electrically contact a connection layer 330, a terminal element 34, or an electrical connection 33, for example. A chip pad metallization may consist of or include a metal such as aluminum, copper, gold or silver, for example. The electrical connections 33 and the terminal elements 34 may also consist of or include a metal such as copper, aluminum, gold, or silver, for example.

According to one example, the at least two semiconductor bodies 320 may be arranged in a half-bridge configuration. Any other arrangements, however, are also possible.

Figure 2:
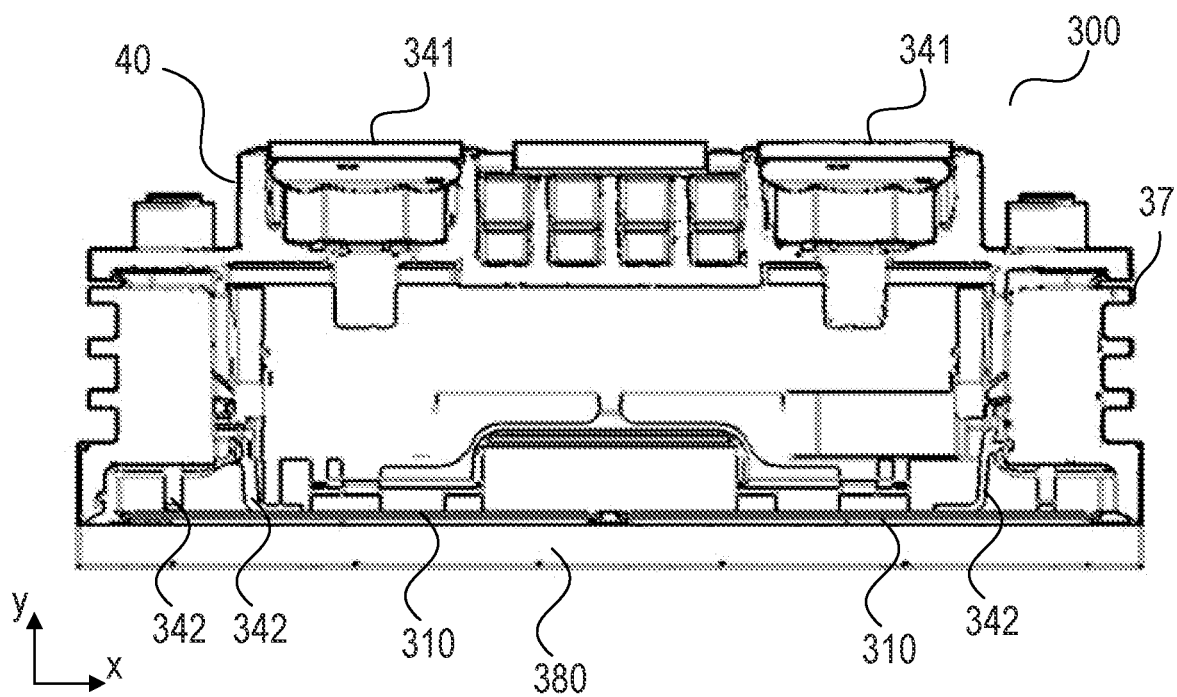
FIG. 2 is a cross-sectional view of another power semiconductor module arrangement.

Now referring to FIG. 2, a cross-sectional view of another power semiconductor module arrangement 300 is exemplarily illustrated. The power semiconductor module arrangement 300 comprises a housing 37 and a base plate 380. In the example illustrated in FIG. 2, two semiconductor substrates 310 are arranged on the base plate 380. As has been described with respect to FIG. 1 above, it is also possible that only one or more than two semiconductor substrates 310 are arranged on the base plate 380. It is also possible that the power semiconductor module arrangement 300 does not comprise any base plate 380 and a single substrate 310 forms the bottom of the housing 37. Any other suitable implementations are also possible.

The power semiconductor module arrangement 300 of FIG. 2 further comprises a mounting arrangement 40 for mounting one or more terminal elements 34 to the housing 37. According to one example, the housing 37 comprises sidewalls. The mounting arrangement 40 may comprise a frame or body. The frame or body may comprise mounting parts (not specifically illustrated in FIG. 2). Such mounting parts may be inserted into corresponding counterparts in the sidewalls of the housing 37. For example, the mounting parts may comprise pins, braces, or hooks which may be inserted into corresponding counterparts such as slots or holes within the frame of the housing 37. The mounting parts may firmly engage with the corresponding counterparts such that the mounting arrangement 40 is firmly attached to the housing 37. The frame or body of the mounting arrangement 40, when mounted to the housing 37, may form at least a part of a cover of the housing 37. One or more terminal elements 34 may extend through the mounting arrangement 40. When the mounting arrangement 40 is mounted to the housing 37, a second end 341 of each of the one or more terminal elements 34 may protrude out of the housing 37 such that it may be contacted from outside the housing 37. A first end 342 of the terminal elements 34 protrudes from the mounting arrangement 40 to the inside of the housing 37. Each of the first ends 342 of the terminal elements 34 may contact one of the sections of the first metallization layer 3111. For example, the first ends 342 may be welded, soldered or sintered to the first metallization layer 3111. According to one example, the first ends 342 are mechanically and electrically coupled to the first metallization layer 3111 by means of ultrasonic welding.

Figure 3:
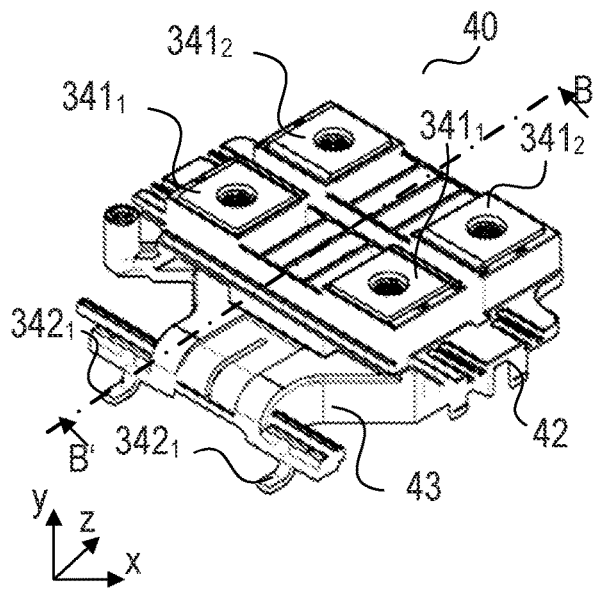
FIG. 3 schematically illustrates a three-dimensional view of an arrangement for mounting terminal elements to a housing.

Now referring to FIG. 3, a mounting arrangement 40 is schematically illustrated in a three-dimensional view. The frame or body 41 may have an essentially square or rectangular shape. However, the frame or body 41 may have several protrusions or projections. The form or shape of the frame or body 41 generally depends on the form and shape of the housing 37 as well as the form and the shape of the terminal elements 34 and the mounting parts 42.

As is exemplarily illustrated in FIG. 3, the mounting arrangement 40 may comprise a frame or body 41 as well as a first terminal element $34_1$ and a second terminal element $34_2$. The first and second terminal elements $34_1$, $34_2$ may extend through the frame or body 41. The first ends $342_1$, $342_2$ of the terminal elements $34_1$, $34_2$ may protrude out of the frame or body 41 on a bottom side, wherein the bottom side of the frame or body 41 is a side which, when the mounting arrangement 40 is mounted to the frame 37 (frame 37 not illustrated in FIG. 3), faces the at least one semiconductor substrate 310. The second ends $341_1$, $341_2$ of the terminal elements $34_1$, $34_2$ protrude out of the frame or body 41 on a top side, wherein the top side is arranged opposite the bottom side and, when the mounting arrangement 40 is mounted to the frame 37 (frame 37 not illustrated in FIG. 3), faces away from the at least one semiconductor substrate 310. A middle part extends between the first end $342_1$, $342_2$ and the second end $341_1$, $341_2$ of a terminal element $34_1$, $34_2$, respectively. The first end $342_1$, $342_2$ and the second end $341_1$, $341_2$ of a terminal element $34_1$, $34_2$ may be short as compared to the middle part of the corresponding terminal element $34_1$, $34_2$. For example, a first end $342_1$, $342_2$ protruding out of the frame or body 41 may have a total length of between 0.1 and 1.5 cm. A second end $341_1$, $341_2$ protruding out of the frame or body 41 may have a total length of between 0.1 and 2.0 cm, for example. The respective middle part extending between the first end $342_1$, $342_2$ and the second end $341_1$, $341_2$ may have a length of between 2.0 and 7.0 cm, for example. The middle part of the first terminal element $34_1$ may be dielectrically insulated from the middle part of the second terminal element $34_2$ by the material of the frame or body 41. According to one example, more than 50%, more than 60% or even more than 70% of the first terminal element $34_1$ and more than 50%, more than 60% or even more than 70% of the second terminal element $34_2$ are completely surrounded by the material of the frame or body 41. That is, the material of the frame or body 41 dielectrically insulates a major part of the first terminal element $34_1$ and a major part of the second terminal element $34_2$ from each other.

The first ends $342_1$, $342_2$ may comprise (soldering or welding) feet that may be mounted to the first metallization layer 311. The second ends $341_1$, $341_2$ may comprise connection plates, for example. Such connection plates may comprise threaded holes formed therein. In this way it is possible, e.g., to mechanically and electrically couple external elements to the connection plates. The terminal elements $34_1$, $34_2$ may be electrically contacted by means of electrically conductive screws, for example (screws not illustrated in the Figures). Such electrically conductive screws may be inserted into the threaded holes. Any external elements (not illustrated) may be mechanically and electrically coupled to the terminal elements $34_1$, $34_2$ by means of such screws. External elements may comprise at least one of connection plates, circuit boards, and connection wires, for example.

Figure 4:
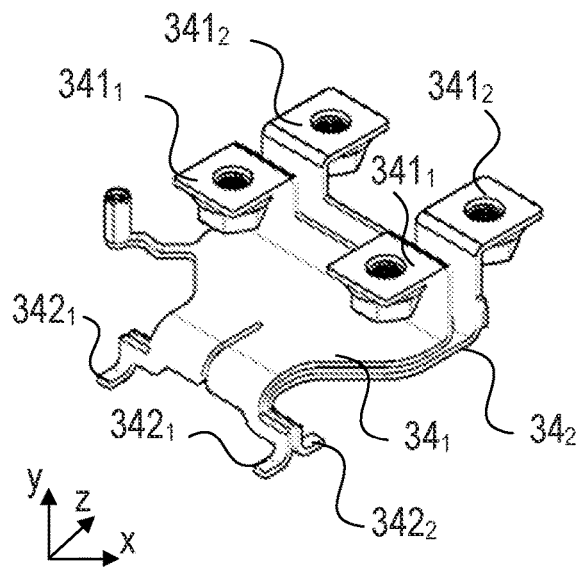
FIG. 4 schematically illustrates a three-dimensional view of terminal elements according to one example.

Now referring to FIG. 4, the first terminal element $34_1$ and the second terminal element $34_2$ are schematically illustrated without the frame or body 41 of the mounting arrangement 40. A middle part of the first and second terminal element $34_1$, $34_2$, that is a part which extends between the first end $342_1$, $342_2$ and the second end $341_1$, $341_2$, may be plate shaped, for example. The specific form of the first and second terminal elements $34_1$, $34_2$ that is illustrated in FIG. 4, however, is only an example. Any other suitable shape is also possible. The middle part of the first terminal element $34_1$ may be essentially parallel to the middle part of the second terminal element $34_2$. The first end $342_1$ of the first terminal element $34_1$ may be bent towards a first direction and the first end $342_2$ of the second terminal element $34_2$ may be bent towards a second direction which is opposite to the first direction. The second end $341_1$ of the first terminal element $34_1$ may also be bent towards the first direction and the second end $341_2$ of the second terminal element $34_2$ may be bent towards the second direction which is opposite to the first direction In the example illustrated in FIGS. 3 and 4, each of the first terminal element $34_1$ and the second terminal element $34_2$ comprises two first ends $342_1$, $342_2$ and two second ends $341_1$, $341_2$. This, however, is only an example. Each of the first terminal element 341 and the second terminal element $34_2$ may comprise only one or even more than two first ends $342_1$, $342_2$ and second ends $341_1$, $341_2$. Any suitable number of first and second ends $342_1$, $342_2$, $341_1$, $341_2$ is possible. The number of first ends $342_1$, $342_2$ may be equal to or differ from the number of second ends $341_1$, $341_2$.

Again referring to FIG. 3, the frame or body 41 may comprise a protrusion 43 which, when the mounting arrangement 40 is mounted to the frame 37, extends from the frame or body 41 towards the at least one semiconductor substrate 310. The protrusion 43 may at least partly surround a hollow space or cavity on the bottom side of the mounting arrangement 40. At least one mounting element 42 may be coupled to the protrusion 43. When inserted into the housing 37 from a top side, the at least one mounting element 42 may engage with a corresponding counterpart of the frame 37, for example. The hollow space or cavity that is defined by the mounting arrangement 40 and the protrusion 43 may be open in at least one horizontal direction in order to allow an exchange of air with the surroundings.

Figure 5:
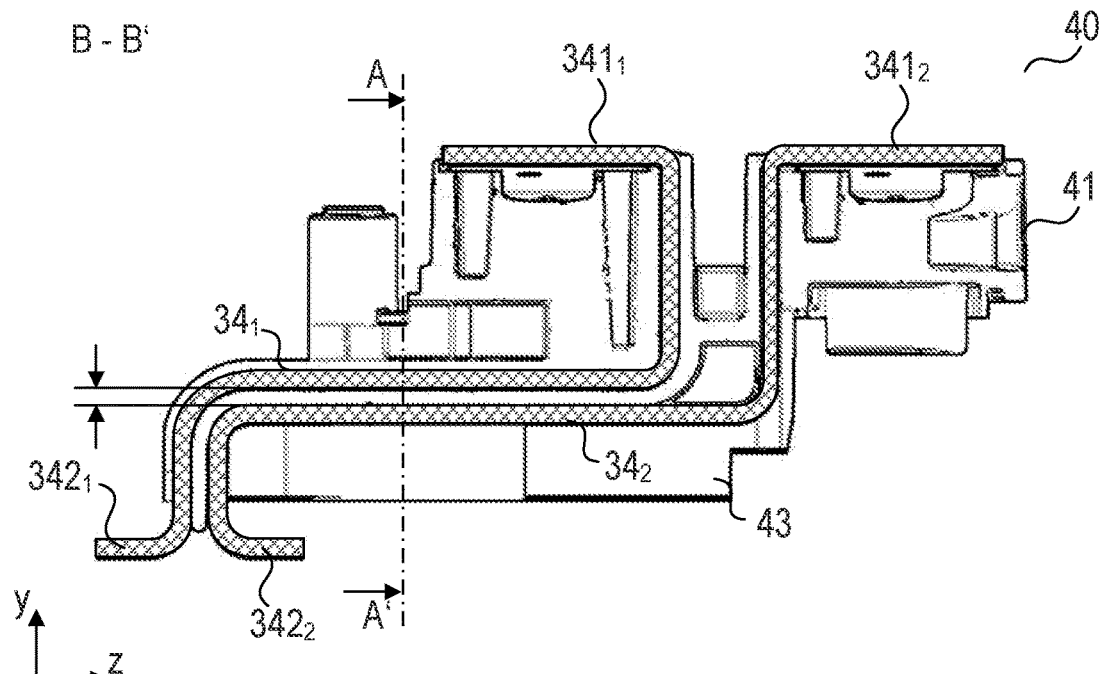
FIG. 5 schematically illustrates a cross-sectional view of an arrangement for mounting terminal elements to a housing.

Now referring to FIG. 5, a cross-sectional view of a mounting arrangement 40 in a section plane B-B' (see FIG. 3) is exemplarily illustrated. As can be seen, inside the frame or body 41, the first terminal element $34_1$ and the second terminal element $34_2$ are dielectrically insulated from each other by the material of the frame or body 41. A distance d3 between the middle part of the first terminal element $34_1$ and the middle part of the second terminal element $34_2$ may be set very accurately. The distance d3 between the middle part of the first terminal element $34_1$ and the middle part of the second terminal element $34_2$ generally depends on the kind of semiconductor arrangement arranged within the housing 37 and the voltages and currents occurring in the power semiconductor module arrangement 300. According to one example, the distance d3 between the middle part of the first terminal element 341 and the middle part of the second terminal element $34_2$ may be between 1 mm and 3 mm, for example, and in particular 1.5 mm. Any other distances d3, however, are also possible. The material of the frame or body 41 is generally able to provide sufficient dielectric insulation between the first terminal element $34_1$ and the second terminal element $34_2$ inside the mounting arrangement 40.

Figure 6:
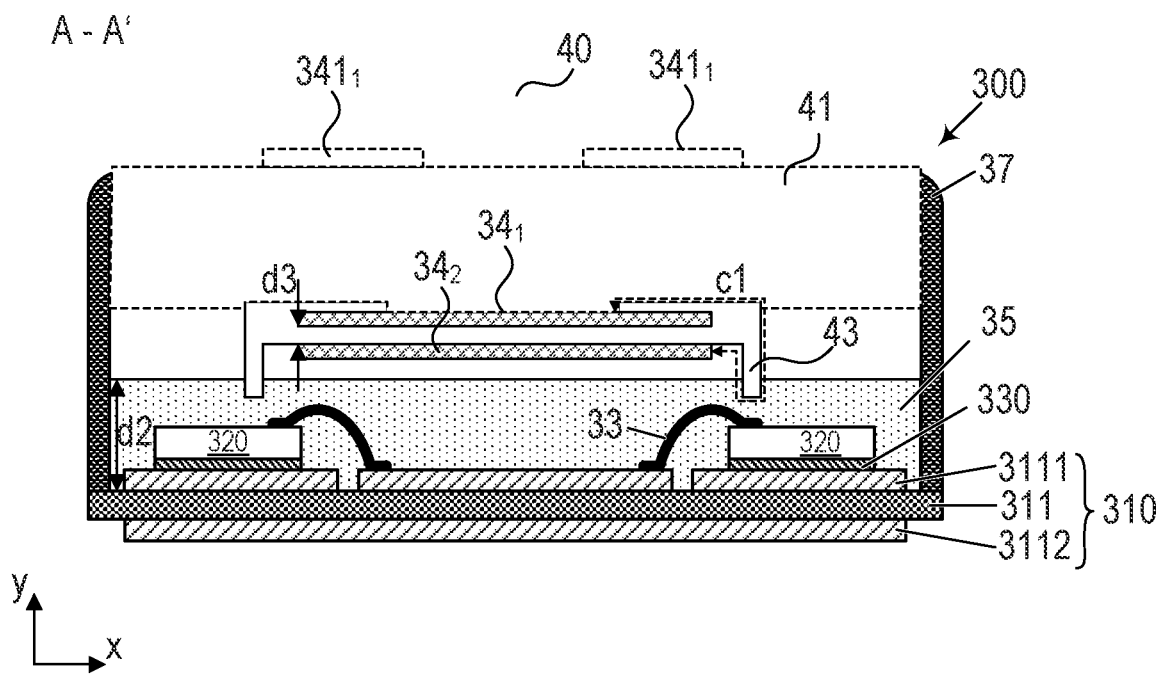
FIG. 6 schematically illustrated a cross-sectional view of a power semiconductor module arrangement including an arrangement for mounting terminal elements to the housing.

A creepage distance between the first terminal element 341 and the second terminal element $34_2$ along the outside of the mounting arrangement 40 may be extended by forming the protrusion 43 on a bottom side of the mounting arrangement 40. This will be described by means of FIG. 6 in the following. FIG. 6 schematically illustrates a cross-sectional view of a power semiconductor module arrangement 300 in a section plane A-A' (see FIG. 5). The power semiconductor module arrangement 300 of FIG. 6 corresponds to the power semiconductor module arrangement 300 that has been described with respect to FIG. 1 above. However, a mounting arrangement 40 comprising first and second terminal elements $34_1$, $34_2$ is inserted into the frame 37. A cross-section of the middle parts of the first and second terminal elements $34_1$, $34_2$ is visible in the cross-sectional view of FIG. 6. The main part of the frame or body 41 is not directly visible in the cross-sectional view of FIG. 6, as it is arranged behind the illustrated image plain. However, for the purpose of explanation the main part of the frame or body 41 as well as the second ends $341_1$, $341_2$ of the first and second terminal elements $34_1$, $34_2$ are illustrated in dashed lines in FIG. 6.

A creepage distance c1 between the first terminal element $34_1$ and the second terminal element $34_2$ along the outside of the mounting arrangement 40 is also illustrated in dashed lines in FIG. 6. As can be seen, the creepage distance c1 runs from the first terminal element 34 along a top side of the frame or body 41 and further along a side wall and a bottom side of the frame or body 41. The protrusion 43 extends the creepage distance c1. Further, the protrusion 43 at least partially immerges into the encapsulation material 35 which covers the semiconductor substrate 310 and the semiconductor bodies 320 mounted thereon. The encapsulation material 35 further reduces any creeping currents as it blocks a direct path through free air. By providing the protrusion 43, it is possible to keep the thickness d2 of the encapsulation material 35 comparably low. Without the protrusions the thickness of the encapsulation material 35 would have to be significantly higher (at least to a height partly encapsulating the frame or body 41) in order to be able to reduce creeping currents. Therefore, by providing protrusions 43, the amount of encapsulation material 35 may be reduced as compared to other power semiconductor module arrangements 300. A reduced thickness d2 of the encapsulation material 35 may further result in reduced tensions and stresses inside the power semiconductor module arrangement 300.

The encapsulation material 35 may comprise silicone gel or may be a rigid molding compound, for example. Materials that are commonly used as encapsulation materials 35 or casting compounds often have a coefficient of thermal expansion CTE that significantly differs from the CTE of the other elements of the power semiconductor module arrangement 300 such as the semiconductor substrate 310 or the semiconductor bodies 320, for example. At the interface between two materials having (significantly) different CTEs, tensions or stresses may occur. Such tensions or stresses may further be increased if the encapsulation material 35 has a large thickness d2. By reducing the thickness d2 of the encapsulation material 35, therefore, the tensions or stresses inside the power semiconductor module arrangement 300 may be reduced.

Figures 7A, 7B:
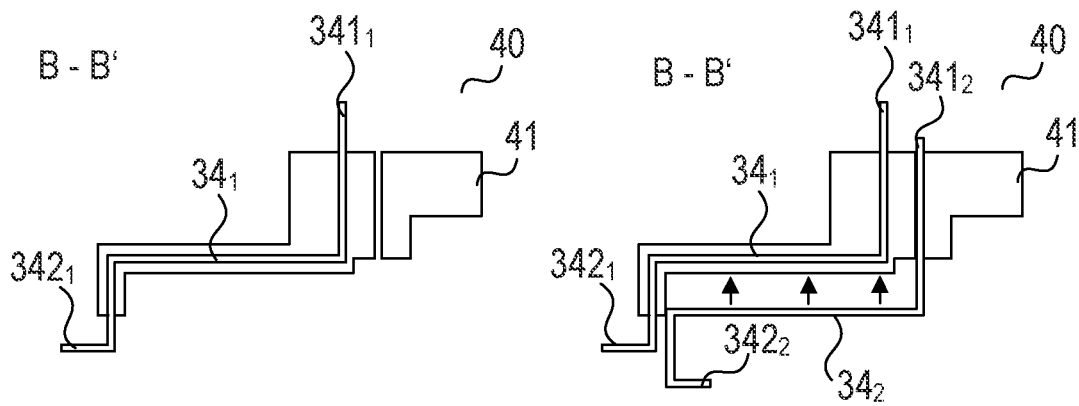
FIGS. 7A to 7D schematically illustrate a method for producing an arrangement for mounting terminal elements to a housing.
Figures 7C, 7D:
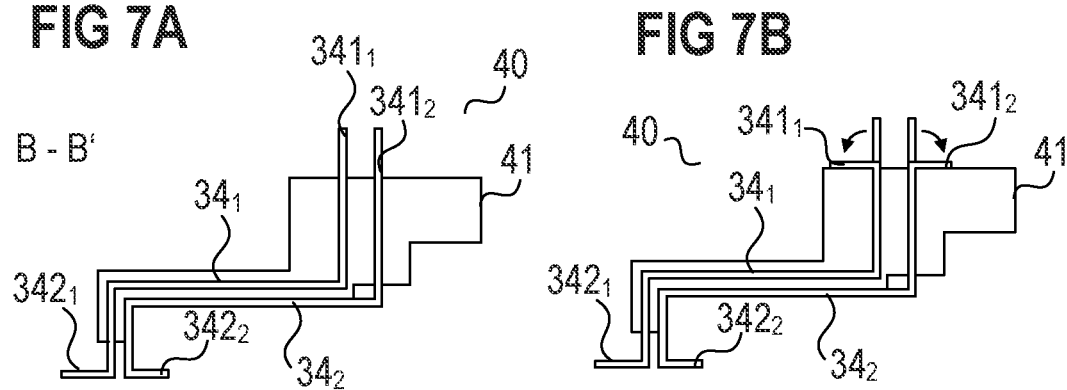

Now referring to FIGS. 7A to 7D, a method for manufacturing a mounting arrangement 40 is exemplarily illustrated. Referring to FIG. 7A, a first terminal element $34_1$ may be injected into the frame or body 41 of the mounting arrangement 40. For example, the frame or body 41 may be formed by injection molding. The material of the frame or body 41 may be injected into an injection mold (not specifically illustrated in FIG. 7A). The first terminal element $34_1$ may be arranged within the injection mold such that, when the material is injected into the injection mold, the first terminal element $34_1$ is injected into the material. A hardening step may follow (not illustrated). The injection mold may have a shape such that certain parts of the frame or body 41 remain free of material and hollow spaces remain in the frame or body 41. The second terminal element $34_2$ may then be inserted into (e.g., pushed or slid into) these hollow spaces. This is exemplarily illustrated in FIG. 7B, where the second terminal element $34_2$ is inserted into the frame or body 41 from the bottom side. This, however, is only an example. It is also possible to slide the second terminal element $34_2$ into the frame or body 41 from the side, if the hollow spaces inside the frame or body 41 are formed accordingly. FIG. 7C schematically illustrates the mounting arrangement after inserting the second terminal element $34_2$. The mounting arrangement 40, therefore, may be formed by first injecting the first terminal element $34_1$ into the frame or body 41 and then inserting (e.g., pushing or sliding) the second terminal element $34_2$ into hollow spaces of the frame or body 41. The hollow spaces may have a form and dimension which corresponds to the form and dimension of the second terminal element $34_2$.

As is exemplarily illustrated in FIGS. 7A to 7C, the second ends $341_1$, $341_2$ of the terminal elements $34_1$, $34_2$ may protrude from the mounting arrangement 40 in a vertical direction y. The second ends $341_1$, $341_2$ may initially be perpendicular to a top surface of the semiconductor substrate 310. However, as is illustrated in FIG. 7D, the second ends $341_1$, $341_2$ may be bent by essentially 90°. That is, in a final position the second ends $341_1$, $341_2$ may extend parallel to the top surface of the semiconductor substrate 310, when the mounting arrangement 40 is mounted to the frame 37.

The second ends $341_1$, $341_2$ may be bent from a mounting position to a final position simultaneously, e.g., after inserting the second terminal element $34_2$ into the frame or body 41. This, however, is only an example. According to another example, the second end $341_1$ of the first terminal element 341 may be bent from a mounting position to a final position directly after injecting the first terminal element $34_1$ into the frame or body 41 and before inserting the second terminal element $34_2$ into the frame or body 41. The second end $341_2$ of the second terminal element $34_2$ may be bent from a mounting position to a final position at a later stage, namely after inserting the second terminal element $34_2$ into the frame or body 41.

According to another example, one or more nuts (not illustrated) may be arranged on the frame or body 41 or within a hollow space within the frame or body 41 before bending the second ends $341_1$, $341_2$ from their mounting position into their final position. When the second ends $341_1$, $341_2$ are in their final position, extending parallel to a top surface of the semiconductor substrate 310, one nut may be arranged below each of the second ends $341_1$, $341_2$ (between the frame or body 41 and the corresponding second end $341_1$, $341_2$). In this way, a screw may be inserted into the frame or body 41 more easily and may firmly engage with the nut and the corresponding second end $341_1$, $341_2$.

In the following, several exemplary power semiconductor module arrangements, mounting arrangements and methods will be described.

1. Example: A power semiconductor module arrangement 300 comprises a semiconductor substrate 310 arranged in a housing 37, wherein at least one semiconductor body 320 is arranged on the semiconductor substrate 310. The power semiconductor module arrangement further comprises a mounting arrangement 40 comprising a frame or body 41, a first terminal element $34_1$, and a second terminal element $34_2$. The mounting arrangement 40 is inserted in and coupled to the housing 37, each of the first and second terminal elements $34_1$, $34_2$ mechanically and electrically contacts the semiconductor substrate 310 with a first end $342_1$, $342_2$, a middle part of each of the first and second terminal elements $34_1$, $34_2$ extends through the frame or body 41, a second end $341_1$, $341_2$ of each of the first and second terminal elements $34_1$, $34_2$ extends outside the housing 37, and the first terminal element 341 is dielectrically insulated from the second terminal element $34_2$ by a portion of the frame or body 41. The first terminal element $34_1$ is injected into and inextricably coupled to the frame or body 41, and the second terminal element $34_2$ is arranged within a hollow space inside the frame or body 42 and is detachably coupled to the frame or body 41.

2. Example: The power semiconductor module arrangement 300 of example 1, further comprising a casting material 35 inside the housing 37 which covers the semiconductor substrate 310 and the at least one semiconductor body 320 mounted thereon.

3. Example: The power semiconductor module arrangement 300 of example 1 or 2, wherein the mounting arrangement 40 further comprises a protrusion 43 which, when the mounting arrangement 40 is inserted in and coupled to the housing 37, extends from the frame or body 41 towards the at least one semiconductor substrate 310.

4. Example: The power semiconductor module arrangement 300 of Example 3, wherein the protrusion 43 partially immerges into the casting material 35, and defines a hollow space between the casting material 35 and the mounting arrangement 40.

5. Example: The power semiconductor module arrangement 300 of example 4, wherein the hollow space is open at least in one horizontal direction.

6. Example: The power semiconductor module arrangement 300 of any of the preceding examples, wherein a distance d3 between the first terminal element $34_1$ and the second terminal element $34_2$ inside the frame or body 41 is between 1 mm and 3 mm.

7. Example: The power semiconductor module arrangement 300 of example 6, wherein the distance d3 between the first terminal element $34_1$ and the second terminal element $34_2$ inside the frame or body 41 is 1.5 mm.

8. Example: The power semiconductor module arrangement 300 of any of the preceding examples, wherein each of the second ends $341_1$, $341_2$, when the mounting arrangement 40 is inserted in and coupled to the housing 37, extends outside the housing 37 and parallel to a top surface of the semiconductor substrate 310, wherein a top surface of the semiconductor substrate 310 is a surface on which the at least one semiconductor body 320 is mounted.

9. Example: The power semiconductor module arrangement 300 of any of the preceding examples, wherein the mounting arrangement 40 forms at least a part of a cover of the housing 37.

10. Example: A mounting arrangement 40 comprising a frame or body 41, a first terminal element $34_1$, and a second terminal element $34_2$, wherein the mounting arrangement 40 is configured to be inserted in and coupled to a housing 37 of a power semiconductor module arrangement 300 comprising a semiconductor substrate 310 arranged in the housing 37, wherein at least one semiconductor body 320 is arranged on the semiconductor substrate 310. Each of the at least two terminal elements $34_1$, $34_2$, when the mounting arrangement 40 is inserted in and coupled to the housing 37, is configured to mechanically and electrically contact the semiconductor substrate 310 with a first end $342_1$, $342_2$. A middle part of each of the first and second terminal elements $34_1$, $34_2$ extends through the frame or body 41, a second end $341_1$, $341_2$ of each of the first and second terminal elements $34_1$, $34_2$ extends outside the housing 37, and the first terminal element $34_1$ is dielectrically insulated from the second terminal element $34_2$ by a portion of the frame or body 41. The first terminal element $34_1$ is injected into and inextricably coupled to the frame or body 41, and the second terminal element $34_2$ is arranged within a hollow space inside the frame or body 42 and is detachably coupled to the frame or body 41.

11. Example: A method comprises injecting a first material into an injection mold, thereby forming a frame or body 41 of a mounting arrangement 40, wherein a first terminal element $34_1$ is arranged in the injection mold and is injected into the first material, and wherein at least one hollow space is formed in the frame or body 41 which is free of the first material. The method further comprises hardening the first material, and inserting a second terminal element $34_2$ into one of the at least one hollow space of the frame or body 41.

12. Example: The method of example 11, further comprising mounting the frame or body 41 with the first and the second terminal element $34_1$, $34_2$ arranged therein to a housing 37 of a power semiconductor module arrangement 300, wherein the power semiconductor module arrangement 300 comprises a semiconductor substrate 310 with at least one semiconductor body 320 mounted thereon arranged inside the housing 37. When the frame or body 41 with the first and the second terminal element $34_1$, $34_2$ arranged therein is mounted to the housing 37, a first end $342_1$ of the first terminal element $34_1$ and a first end $342_2$ of the second terminal element $34_2$ mechanically and electrically contact the semiconductor substrate 310.

13. Example: The method of example 12, further comprising forming a mechanical and electrical joint between the first end $342_1$ of the first terminal element $34_1$ and the semiconductor substrate 310, and between the first end $342_2$ of the second terminal element $34_2$ and the semiconductor substrate 310 by means of ultrasonic welding.

14. Example: The method of any of examples 11 to 13, wherein forming the frame or body 41 comprises forming a protrusion 43 that, when the frame or body 41 with the first and the second terminal element $34_1$, $34_2$ arranged therein is mounted to the housing 37 extends from the frame or body 41 towards the semiconductor substrate 310, the method further comprising filling a casting material 35 into the housing 37 such that the casting material 35 covers the semiconductor substrate 310 and the at least one semiconductor body 320 mounted thereon, and the protrusion 43 partially immerges into the casting material 35.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
   a housing;
   first and second electrical contacts arranged within the housing; and
   a mounting arrangement comprising a frame or body, a first terminal element, and a second terminal element,
   wherein the mounting arrangement is inserted in and coupled to the housing,
   wherein first ends of the first and second terminal elements mechanically and electrically contact the first and second electrical contacts, respectively,
   wherein a middle part of each of the first and second terminal elements extends through the frame or body,
   wherein a second end of each of the first and second terminal elements extends outside the housing,
   wherein the first terminal element is dielectrically insulated from the second terminal element by a portion of the frame or body,
   wherein the first terminal element is injected into and inextricably coupled to the frame or body,
   wherein the second terminal element is arranged within a hollow space inside the frame or body and is detachably coupled to the frame or body.

2. The power semiconductor module arrangement of claim 1, wherein a semiconductor substrate is arranged in the housing, wherein at least one semiconductor body is arranged on the semiconductor substrate, and wherein each of the first and second terminal elements mechanically and electrically contacts the semiconductor substrate.

3. The power semiconductor module arrangement of claim 2, wherein the mounting arrangement further comprises a protrusion which, when the mounting arrangement is inserted in and coupled to the housing, extends from the frame or body towards the semiconductor substrate.

4. The power semiconductor module arrangement of claim 2, further comprising a casting material inside the housing and covering the semiconductor substrate and the at least one semiconductor body.

5. The power semiconductor module arrangement of claim 4, wherein the mounting arrangement further comprises a protrusion which, when the mounting arrangement is inserted in and coupled to the housing, extends from the frame or body towards the semiconductor substrate.

6. The power semiconductor module arrangement of claim 5, wherein the protrusion partially immerges into the casting material and defines a hollow space between the casting material and the mounting arrangement.

7. The power semiconductor module arrangement of claim 6, wherein the hollow space is open at least in one horizontal direction.

8. The power semiconductor module arrangement of claim 2, wherein each of the second ends, when the mounting arrangement is inserted in and coupled to the housing, extends outside the housing and parallel to a top surface of the semiconductor substrate, and wherein a top surface of the semiconductor substrate is a surface on which the at least one semiconductor body is mounted.

9. The power semiconductor module arrangement of claim 1, wherein a distance between the first terminal element and the second terminal element inside the frame or body is between 1 mm and 3 mm.

10. The power semiconductor module arrangement of claim 9, wherein the distance between the first terminal element and the second terminal element inside the frame or body is 1.5 mm.

11. The power semiconductor module arrangement of claim 1, wherein the mounting arrangement forms at least a part of a cover of the housing.

12. The power semiconductor module arrangement of claim 1, wherein the hollow space is open in at least one horizontal direction in order to allow an exchange of air with the surroundings.

13. A mounting arrangement, comprising:
- a frame or body;
- a first terminal element; and
- a second terminal element;
- wherein the mounting arrangement is configured to be inserted in and coupled to a housing of a power semiconductor module arrangement comprising first and second electrical contacts arranged in the housing,
- wherein first ends of the first and second terminal elements, when the mounting arrangement is inserted in and coupled to the housing, are configured to mechanically and electrically contact the first and second electrical contacts, respectively,
- wherein a middle part of each of the first and second terminal elements extends through the frame or body,
- wherein a second end of each of the first and second terminal elements, when the mounting arrangement is inserted in and coupled to the housing, extends outside the housing,
- wherein the first terminal element is dielectrically insulated from the second terminal element by a portion of the frame or body,
- wherein the first terminal element is injected into and inextricably coupled to the frame or body,
- wherein the second terminal element is arranged within a hollow space inside the frame or body and is detachably coupled to the frame or body.

14. The mounting arrangement of claim 13, wherein the hollow space is open in at least one horizontal direction in order to allow an exchange of air with the surroundings.

* * * * *